United States Patent [19]

Taguchi

[11] Patent Number: 5,579,329

[45] Date of Patent: Nov. 26, 1996

[54] SEMICONDUCTOR LASER APPARATUS, INFORMATION RECORDING/REPRODUCING APPARATUS AND IMAGE RECORDING APPARATUS

[75] Inventor: Toyoki Taguchi, Yokohama, Japan

[73] Assignee: Kabushiki Kaisha Toshiba, Kawasaki, Japan

[21] Appl. No.: 465,413

[22] Filed: Jun. 5, 1995

[30] Foreign Application Priority Data

Jul. 15, 1994 [JP] Japan .................................. 6-162580

[51] Int. Cl.$^6$ ............................................ H01S 3/00
[52] U.S. Cl. ............................................ 372/38
[58] Field of Search .............................. 372/12, 26, 29, 372/38

[56] References Cited

U.S. PATENT DOCUMENTS 5,097,473 3/1992 Taguchi ...................................... 372/38
5,250,796 10/1993 Taguchi et al. .

FOREIGN PATENT DOCUMENTS 2-205087 8/1990 Japan .

OTHER PUBLICATIONS

"Laser Drive IC Realizing Real–Time APC Control, TA8546FN", Takashi Kimura et al., Toshiba Review, 49 (11):790–793 (1994) no month. English Abstract in Japanese.

Primary Examiner—Rodney B. Bovernick
Assistant Examiner—Robert E. Wise
Attorney, Agent, or Firm—Finnegan, Henderson, Farabow, Garrett & Dunner, L.L.P.

[57] ABSTRACT

A semiconductor laser apparatus comprises a semiconductor laser, a photodetector, first and second variable gain units, a controllable amplifying unit, a driving unit, and a compensation unit. A control signal is supplied to one of input terminals of each of the first and second variable gain units and an output signal of the photodetector is negative-fed back to the other of the input terminals of each of the first and second variable gain units. A varied gain of an error between the control signal and the output signal is output independently from each of the first and second variable gain units. The controllable amplifying unit amplifies the error signal from the first variable gain unit with desired frequency characteristics. The driving unit supplies a driving current to the semiconductor laser in accordance with a drive control signal from the controllable amplifying unit. The compensation unit negatively feeds back a compensation current to the negative feedback terminals to compensate a phase delay on the basis of the error signal output from the second variable gain unit.

29 Claims, 12 Drawing Sheets

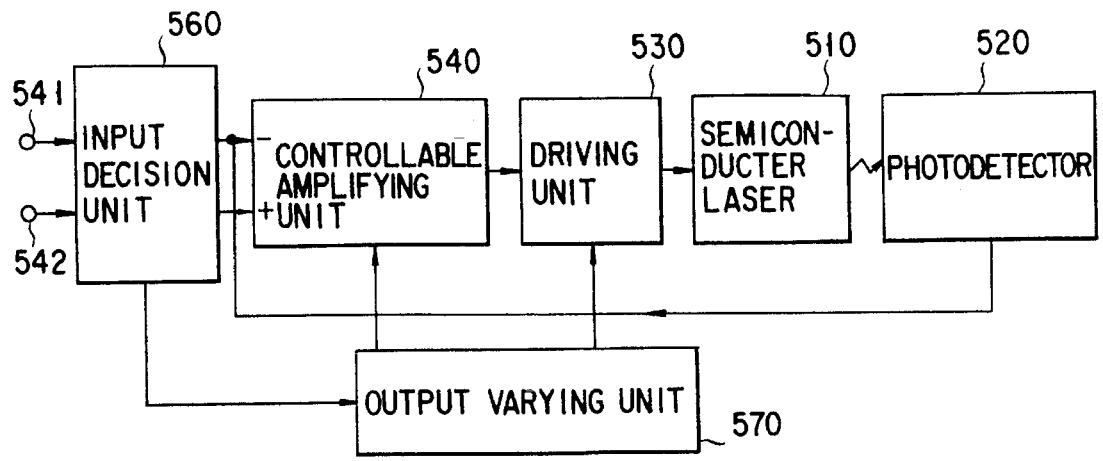
F I G. 9
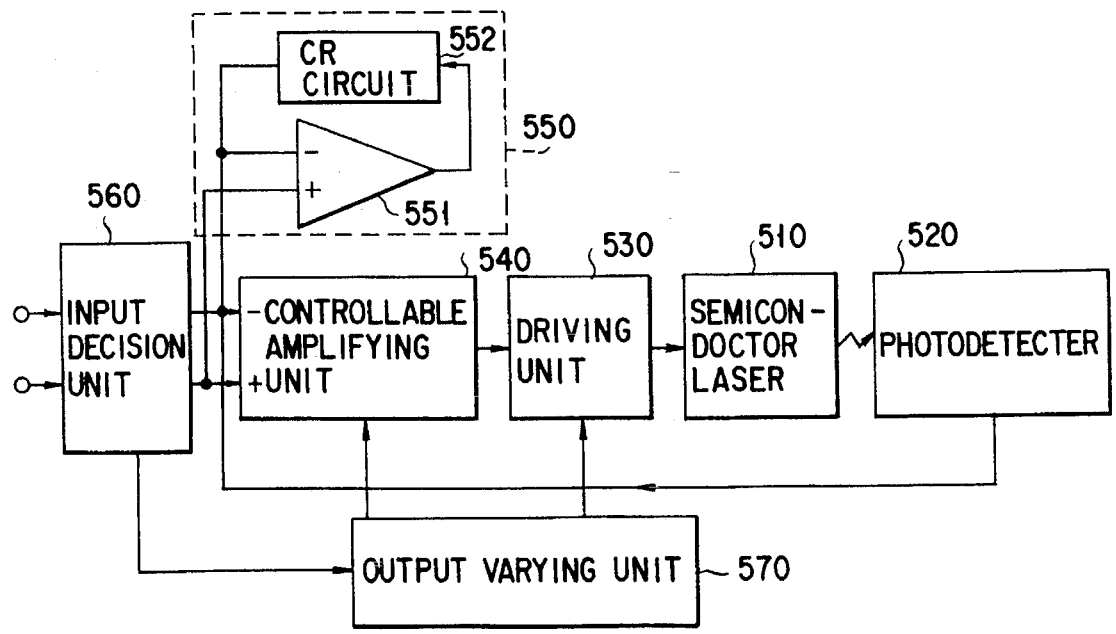
F I G. 10

SEMICONDUCTOR LASER APPARATUS, INFORMATION RECORDING/REPRODUCING APPARATUS AND IMAGE RECORDING APPARATUS

BACKGROUND OF THE INVENTION

1. Field of the Invention

The present invention relates to a semiconductor laser apparatus used in an optical disk apparatus, a laser printer, an optical data communication system, etc., to an information recording/reproducing apparatus, such as an optical disk apparatus, using the semiconductor laser apparatus, and to an image recording apparatus, such as a laser printer or a copying machine, using the semiconductor laser apparatus.

2. Description of the Related Art

Semiconductor lasers are widely used in systems of optical disk apparatuses, which are large capacity memory apparatuses, or laser printers, because of advantages of easy modulation of direct light intensity, a small size, low power consumption and high efficiency.

Conventional semiconductor lasers, however, have a disadvantage in that the amount of emission light varies due to the following characteristics:

(1) A variation in differential quantitative due to a temperature variation and a variation with the passing of time, (2) A variation in threshold current due to a temperature variation and reflection light (return light ), and (3) Occurrence of mode hopping noise due to reflection light (return light).

In order to drive the semiconductor laser, a control circuit for monitoring and stabilizing the amount of output light of the semiconductor laser is indispensable. In particular, in an optical disk apparatus, in order to increase the memory capacity and data transfer rate, light intensity modulation with higher precision and reduction in noise at the time of reproduction are required.

A wide band front APC method is known as a method for reducing laser noise with a currently available semiconductor laser used as a light source of an optical disk apparatus (e.g. TAGUCHI, HOSHINO: "High-Precision Laser Control System (11)" in Optical Disk Apparatuses, General Meeting in Spring 1991 of the Institute of Electronics, Information and Communications Engineering, C-372, etc.)

In the wide band front APC method, a light beam actually radiated on an optical disk in a recording/reproducing mode, i.e. part of a front beam of a semiconductor laser is guided to, and detected by, a photodetector. A detection signal from the photo-detector is used for light output control of the semiconductor laser. According to this method, the control band is increased and thus the laser noise is reduced.

Regarding the wide band front APC, it is important how the control band is increased in relation to the reproduction signal band. A technique for making the control band of the wide band front APC wider than the reproduction signal band is disclosed in, e.g. Jap. Pat. Appln. KOKAI No. 4-208581 (the title of the invention: "Semiconductor Laser Apparatus").

The semiconductor laser apparatus is provided with an error detection circuit for outputting an error signal representing an error between an output signal negatively fed back from a photodetector for detecting an output beam of the semiconductor laser and an external control signal. A feedback loop is formed which controls a drive current for the semiconductor laser on the basis of the error signal. In addition, the semiconductor laser apparatus is provided with a compensation circuit for negatively feeding back a compensation current for compensating a phase delay of the feedback loop to an input terminal of the error detection circuit.

In the prior art, however, no consideration has been paid to the variation in feedback amount of the feedback loop due to the aforementioned variation in differential quantitative efficiency or the variation with the passing of time of the semiconductor laser, or the variance in adjustment of optical systems among apparatuses.

Nor has consideration been paid to the variation in frequency characteristics due to a delay in the semiconductor laser or a variation in junction capacitance in the photodetector.

If the aforementioned variation feedback amount or frequency characteristics occurs, laser noise cannot fully be reduced, in particular, in an information recording/reproducing apparatus such as an optical disk apparatus. Furthermore, unnecessary noise occurs due to degradation in transient response characteristics to noise.

Moreover, the degradation in transient pulse response characteristics at the time of recording poses a more serious problem, since it results in a recording mark variation and greatly loses a reproduction margin.

On the other hand, in a laser printer, etc., there is a demand for a much higher light turn/off ratio, i.e. a light turn on/off ratio. However, in a turn-off region, i.e. a threshold lower than laser oscillation, the feedback efficiency is greatly lowered and high light turn-off ratio cannot be obtained. This problem will now be described with reference to simulation results shown in FIGS. 1 and 2.

FIG. 1 shows a response waveform of a monitor PD current at the time of turn on/off. It is understood that the control system is deteriorated because the light is not fully turned off at the time instant of turn off, although the light has high-speed responsiveness and stable at the time of turn on.

FIG. 2 shows a response waveform of an LD driving current at the time of turn on/off. It is understood that the driving current can be controlled to only the level of threshold current at the time instant of turn off.

As has been mentioned above, in the conventional semiconductor laser apparatus, no consideration is paid to the variation in feedback amount of the feedback loop due to the variation in differential quantitative efficiency or the variation with the passing of time of the semiconductor laser, or the variance in frequency characteristics due to a delay in the semiconductor laser or a variation in junction capacitance in the photodetector.

Thus, in the case of the information recording/reproducing apparatus such as an optical disk apparatus, the effect of laser noise reduction is not sufficient and unnecessary noise is caused by the degradation in transient response characteristics to noise.

In the case where the performance in light turn-off ratio is required, the feedback efficiency decreases greatly at a level lower than the laser oscillation threshold and a high light turn-off ratio cannot be obtained.

An object of the present invention is to provide a semiconductor laser apparatus wherein the feedback amount of a feedback system for negatively feeding back a driving current of a semiconductor laser is automatically corrected without damaging the dynamic range of a control amplifier, the variation in characteristics due to a delay in a semiconductor laser or a variation in junction capacitance in the photodetector, and a high light turn-off ratio is obtained.

Another object of the invention is to provide an information recording/reproducing apparatus which uses the aforementioned semiconductor laser apparatus and can obtain excellent recording/reproducing characteristics.

Still another object of the invention is to provide an image recording apparatus which uses the aforementioned semiconductor laser apparatus and can obtain high-precision image quality.

SUMMARY OF THE INVENTION

The objects of the invention can be achieved by a semiconductor apparatus comprising:

- a semiconductor laser;
- a photodetector for detecting an output beam of the semiconductor laser;
- a driving unit for driving the semiconductor laser;
- a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and
- a compensation unit for actively controlling the phase of a feedback control loop constituted by the photodetector, the driving unit and the controllable amplifying unit in accordance with temporal and electrical behaviors of the feedback control loop.

The objects of the invention can also be achieved by a semiconductor apparatus comprising:

- a semiconductor laser;
- a photodetector for detecting an output beam of the semiconductor laser;
- a driving unit for driving the semiconductor laser;
- a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and
- a mode varying unit for varying the mode of the feedback control in accordance with the value of the control signal.

The objects of the invention can also be achieved by an information recording/reproducing apparatus comprising:

- a semiconductor laser apparatus having a semiconductor laser, a photodetector for detecting an output beam of the semiconductor laser, a driving unit for driving the semiconductor laser, a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and a compensation unit for actively controlling the phase of a feedback control loop constituted by the photodetector, the driving unit and the controllable amplifying unit in accordance with temporal and electrical behaviors of the feedback control loop;
- a radiation unit for radiating an output beam of the semiconductor laser apparatus to a recording medium;
- a detection unit for detecting a reflection beam from the recording medium;
- a reproduction signal generating unit for generating a reproduction signal from an output of the detection unit; and
- a control signal generating unit for generating the control signal to be supplied to the semiconductor laser apparatus.

The objects of the invention can also be achieved by an information recording/reproducing apparatus comprising:

- a semiconductor laser apparatus having a semiconductor laser, a photodetector for detecting an output beam of the semiconductor laser, a driving unit for driving the semiconductor laser, a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and a mode varying unit for varying the mode of the feedback control in accordance with the value of the control signal;
- a radiation unit for radiating an output beam of the semiconductor laser apparatus to a recording medium;
- a detection unit for detecting a reflection beam from the recording medium;
- a reproduction signal generating unit for generating a reproduction signal from an output of the detection unit; and
- a control signal generating unit for generating the control signal to be supplied to the semiconductor laser apparatus.

The objects of the invention can also be achieved by an image recording apparatus comprising:

- a semiconductor laser apparatus having a semiconductor laser, a photodetector for detecting an output beam of the semiconductor laser, a driving unit for driving the semiconductor laser, a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and a compensation unit for actively controlling the phase of a feedback control loop constituted by the photodetector, the driving unit and the controllable amplifying unit in accordance with temporal and electrical behaviors of the feedback control loop;
- a scanning unit for scanning an output beam of the semiconductor laser apparatus on a photosensitive body;
- an image forming unit for making visible a latent image formed by the scanning of the scanning unit; and
- a reproduction signal generating unit for generating the control signal to be supplied to the semiconductor laser apparatus.

The objects of the invention can also be achieved by an image recording apparatus comprising:

- a semiconductor laser apparatus having a semiconductor laser, a photodetector for detecting an output beam of the semiconductor laser, a driving unit for driving the semiconductor laser, a controllable amplifying unit for receiving an externally supplied control signal and an output beam of the photodetector and supplying a drive signal determined by the control signal and the output beam of the photodetector to the driving unit, thereby feedback-controlling the output of the semiconductor laser; and a mode varying unit for varying the mode of the feedback control in accordance with the value of the control signal;
- a radiation unit for radiating an output beam of the semiconductor laser apparatus to a recording medium;

a detection unit for detecting a reflection beam from the recording medium; and a reproduction signal generating unit for generating the control signal to be supplied to the semiconductor laser apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 9 is a block diagram schematically showing a semiconductor laser apparatus according to a second principle of the present invention;

FIG. 10 is a block diagram schematically showing a semiconductor laser apparatus according to a third principle of the present invention;

DETAILED DESCRIPTION OF THE PREFERRED EMBODIMENTS

A semiconductor laser apparatus according to a first principle of the present invention will now be described with reference to FIG. 3.

Figure 1:
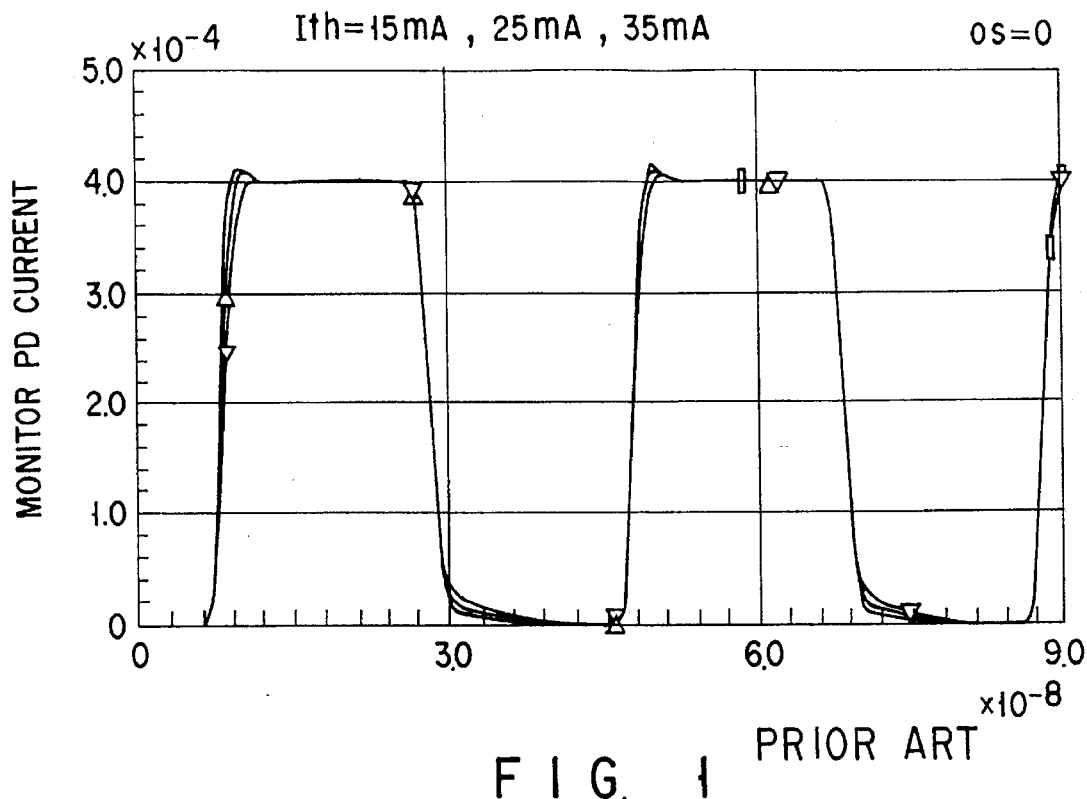
FIG. 1 is a graph showing a monitor PD current waveform at the time of on/off control of a semiconductor laser in a conventional semiconductor laser apparatus.
Figure 2:
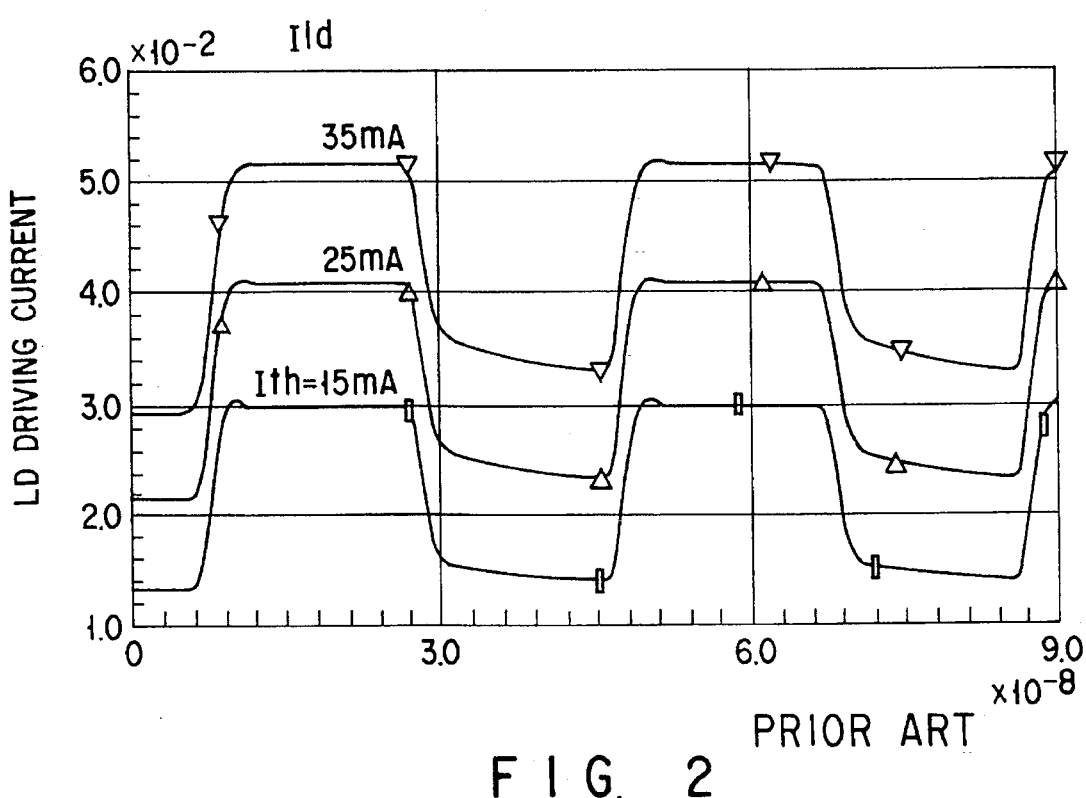
FIG. 2 is a graph showing an LD driving current waveform at the time of on/off control of the semiconductor laser in the conventional semiconductor laser apparatus.
Figure 3:
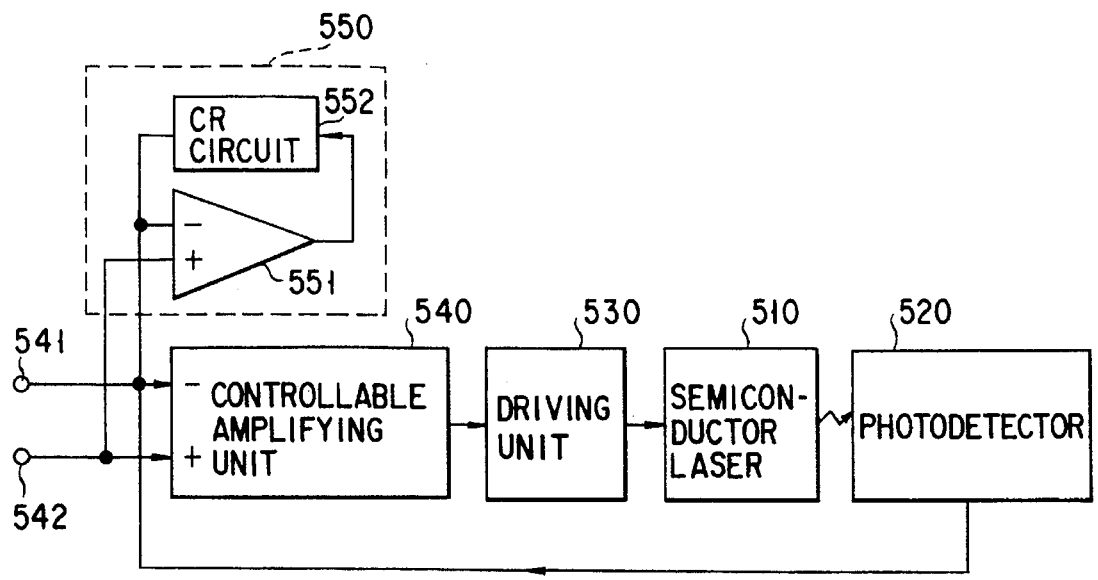
FIG. 3 is a block diagram schematically showing a semiconductor laser apparatus according to a first principle of the present invention.

As is shown in FIG. 3, the semiconductor laser apparatus according to the first principle comprises a semiconductor laser 510, a photodetector 520, a driving unit 530, a controllable amplifying unit 540 and a compensation unit 550. The photodetector 520 detects an output light beam from the semiconductor laser 510. The driving unit 530 supplies a driving current to the semiconductor laser 510. The controllable amplifying unit 540 APC-controls the output of the semiconductor laser by feedback control. For this purpose, the controllable amplifying unit 540 receives a control signal from terminals 531 and 542 and an output light signal of the photodetector 520 and supplies a driving signal determined by the control signal and output light signal to the driving unit 530. The compensation unit 550 actively controls the phase, in particular, a phase delay, of a feedback loop constituted by the photodetector 520, driving unit 530 and controllable amplifying unit 540, in accordance with temporal and electrical behaviors of the feedback loop.

Figure 4:
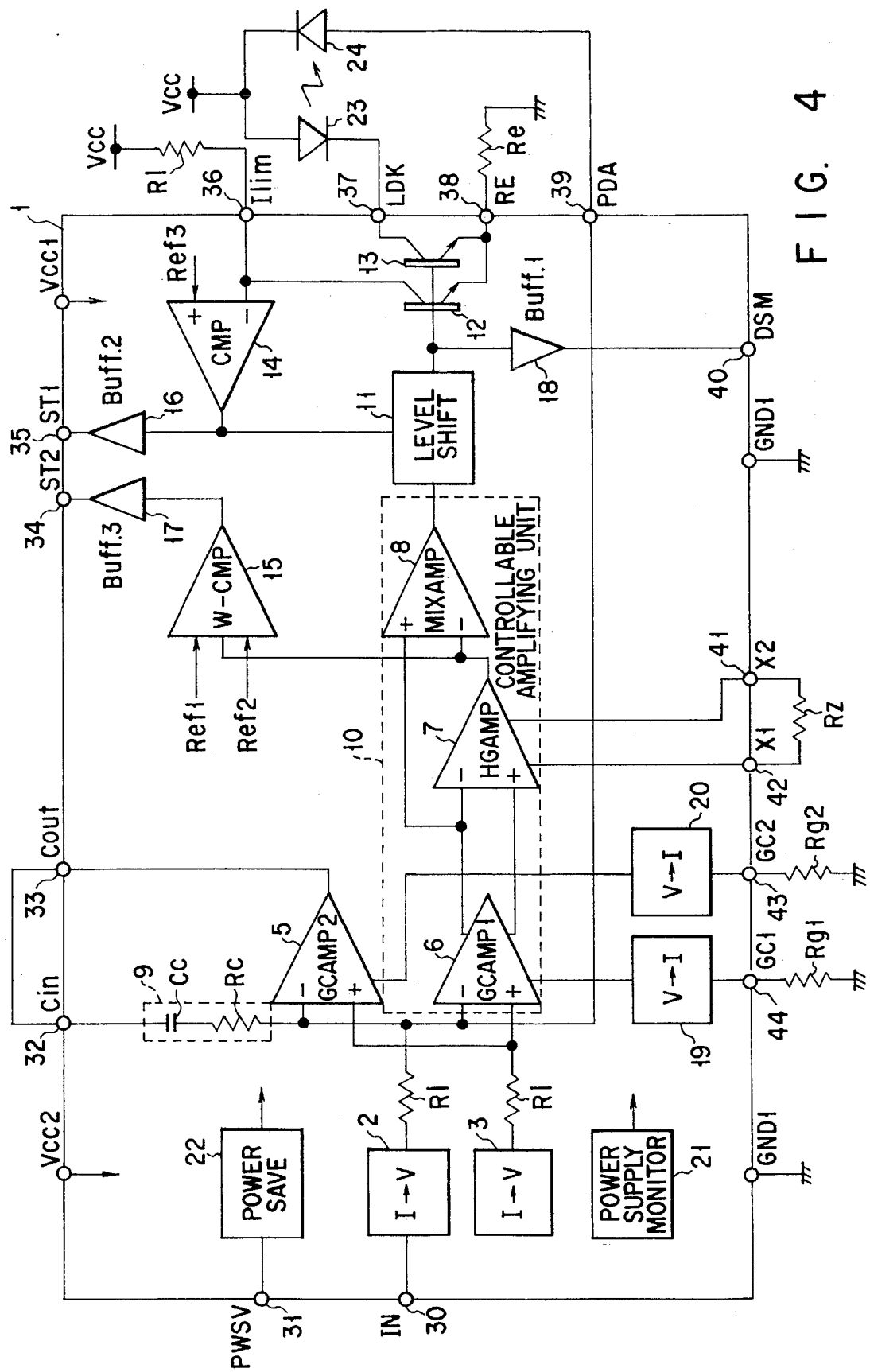
FIG. 4 is a detailed circuit diagram of a semiconductor laser apparatus according to a first embodiment of the present invention.

FIG. 4 shows a first embodiment of the semiconductor laser apparatus according to the first principle shown in FIG. 3. As is shown in FIG. 4, the semiconductor laser apparatus of the first embodiment comprises an integrated semiconductor laser control circuit 1, a semiconductor laser 23 connected to the laser control circuit 1, a photodetector 24 for detecting an output light beam of the semiconductor laser 23 and a plurality of resistors connected externally to the semiconductor laser control circuit 1.

The structure of the semiconductor laser control circuit 1 will now be described. A control current signal is input to an input terminal 30 from the outside. The control current signal is converted to a control voltage signal by a current/voltage converter 2. The control voltage signal is supplied to each of a controllable amplifying unit 10 and a variable gain type differential amplifier 5 functioning as second variable gain means. The controllable amplifying unit 10 comprises a variable gain type differential amplifier 6 functioning as first variable gain means, an operational amplifier 7 and a differential amplifier 8 for subjecting outputs of both amplifiers 6 and 7 to subtraction. The controllable amplifying unit 10 outputs a driving control signal.

The driving control signal output from the differential amplifier 8 is shifted to a desired potential level by a level shift 11. The level-shifted driving control signal is input to each of a buffer 18, a transistor 12 for detecting a driving current of the semiconductor laser 23, and a transistor 13 for supplying a driving current to the semiconductor laser 23.

The damping capacity of the transistor 13 is about 100 times that of the transistor 12. About 1% of the driving current flows through the transistor 12, and the driving current is monitored on the basis of a voltage drop in an external resistor R1. The comparator 14 compares the voltage drop with a reference voltage Ref3 and outputs a comparison result to the outside via a buffer 16. In addition, the comparator 14 limits the driving current by lowering the output potential of the level shift 11.

A window comparator 15 determines the control state when the output voltage of the operational amplifier 7 is in a range between Ref1 and Ref2, and outputs a determination result to the outside via a buffer 17.

In addition, the semiconductor laser control circuit 1 includes a power supply monitor 21 for detecting a decrease in power supply voltage and automatically halting the control operation, and a power save circuit 22 for starting and stopping the control operation by external control.

The control voltage signal from the current/voltage converter 2 is a modulated signal voltage which is intensity-modulated so as to represent, e.g. digital information. The modulated signal voltage is supplied to an inverted input terminal of the controllable amplifying unit 10 as a control current via a resistor element Ri. A reference voltage generated by a current/voltage converter 3 having the same structure as the current/voltage converter 2 is input to the non-inverted input terminal of the controllable amplifying unit 10.

An anode of the photodetector 24 is connected to a terminal 39. A monitor current from the photodetector 24 is negative-fed back to the inverted input terminal of the controllable amplifying unit 10 via the terminal 39. Thus, the output beam from the semiconductor laser 23 is intensity-modulated in proportion to the modulated signal voltage which is the control voltage signal from the current/voltage converter 2. That is, the semiconductor laser 23 is auto-power-controlled.

The gain of the operational amplifier 7 can be varied by an external resistor Rz, and the zero-point frequency for avoiding the influence of junction capacitance of the photodetector 24 can be optimized.

Voltage/current converters 19 and 20 pull up potentials provided from input terminals 44 and 43 in their insides on the basis of reference voltage and resistance. The pull-up levels of the voltage/current converters 19 and 20 can be set by voltage input or external resistors Rg1 and Rg2. Output currents from the voltage/current converters 19 and 20 are input to the variable gain type differential amplifiers 6 and 5, respectively.

In general, the dynamic range of an output from a variable gain type differential amplifier varies greatly due to a variation of gain. Thus, if the variable gain type differential amplifier is provided at the rear stage of the circuit (control amplifying unit), the dynamic range of the control system lowers greatly. It is therefore desirable that the variable gain type differential amplifier be provided at the first stage of the circuit (control amplifying unit). That the differential amplifier has a gain varying function is indispensable to compensate a variance among devices and optical systems.

Figure 5:
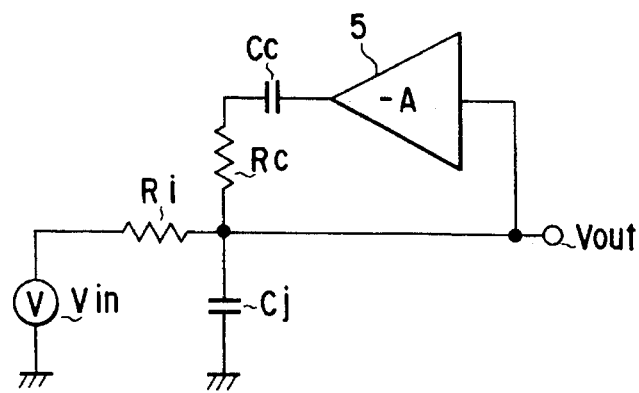
FIG. 5 is a circuit diagram showing a loop constituted by a differential variable amplifier 5 and a compensation circuit 9 shown in FIG. 4.

A description will now be given of the effect of separation between the variable gain type differential amplifier 5 and control amplifying unit 10, which is one of the features of the present invention. An output terminal of the variable gain type differential amplifier 5 is connected to a terminal 33. The terminal 33 is connected to a terminal 32 on the outside of the semiconductor laser control circuit 1. Thus, a phase delay compensation current, i.e. a compensation current to compensate degradation of response characteristics due to an influence of junction capacitance of the semiconductor laser 24, is generated by a compensation circuit 9 comprising an RC series circuit. In this case, a loop constituted by the variable gain type differential amplifier 5 and compensation 9 can be regarded as an independent feedback loop, as shown in FIG. 5. Specifically, the phase characteristics of Vout alone, i.e. an input to the controllable amplifying unit 10, may be considered with respect to the operation of the semiconductor laser 23.

Figure 6:
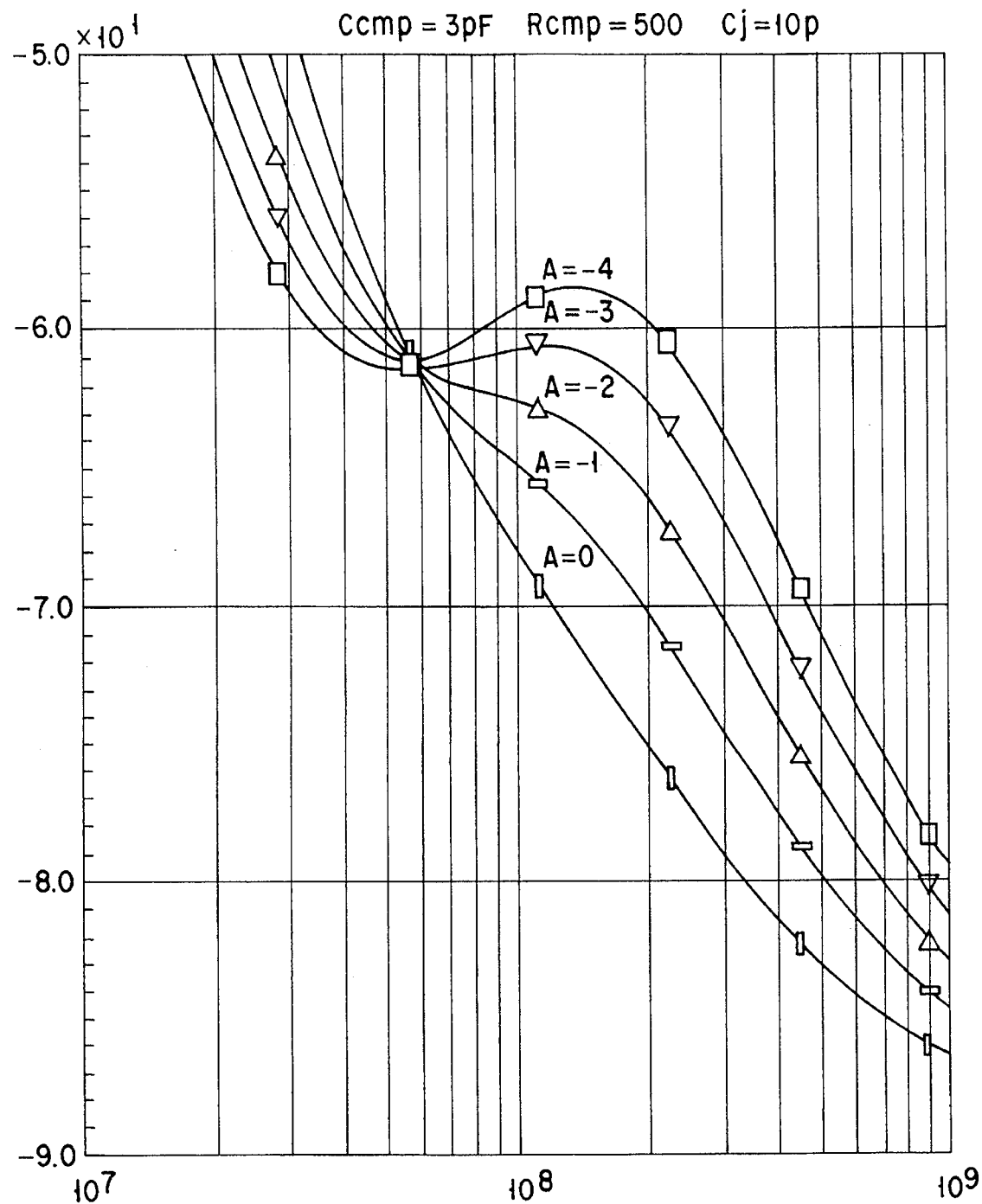
FIG. 6 is a graph showing a phase progress effect obtained when the gain of the differential variable amplifier 5 shown in FIG. 4 is varied.

FIG. 6 shows the phase progress effect obtained at the time the gain of the variable gain type differential amplifier 5 has been varied. As is shown in FIG. 6, sufficient phase progress effect is obtained only by varying the gain of the differential amplifier 5. There is no need to alter the constant of the compensation circuit 9. Thus, the apparatus of this embodiment can be built in an integrated circuit and is cost-effective.

On the other hand, a necessary gain in the control system can be set with out adjustment, if the control gain cross frequency, i.e. control band is determined at first. In order to achieve this effect, it is necessary to flatten the frequency characteristics of the variable gain type differential amplifier 5 up to 1.5 times the target control band.

As has been described above, in the present embodiment, even if the gain of the first variable gain amplifying means provided at the first stage is varied, the dynamic range of the rear-stage controllable amplifying means with a higher gain is not degraded. In particular, high-precision control less vulnerable to a variance in threshold current can be achieved.

Furthermore, since the second variable gain type amplifying means is independent from the feedback control loop, the phase compensation of the feedback can be adjusted independently. Since the gain can be varied, the constant of the compensation means need not be altered. Thus, the cost for parts and adjustment can be reduced.

Figure 7:
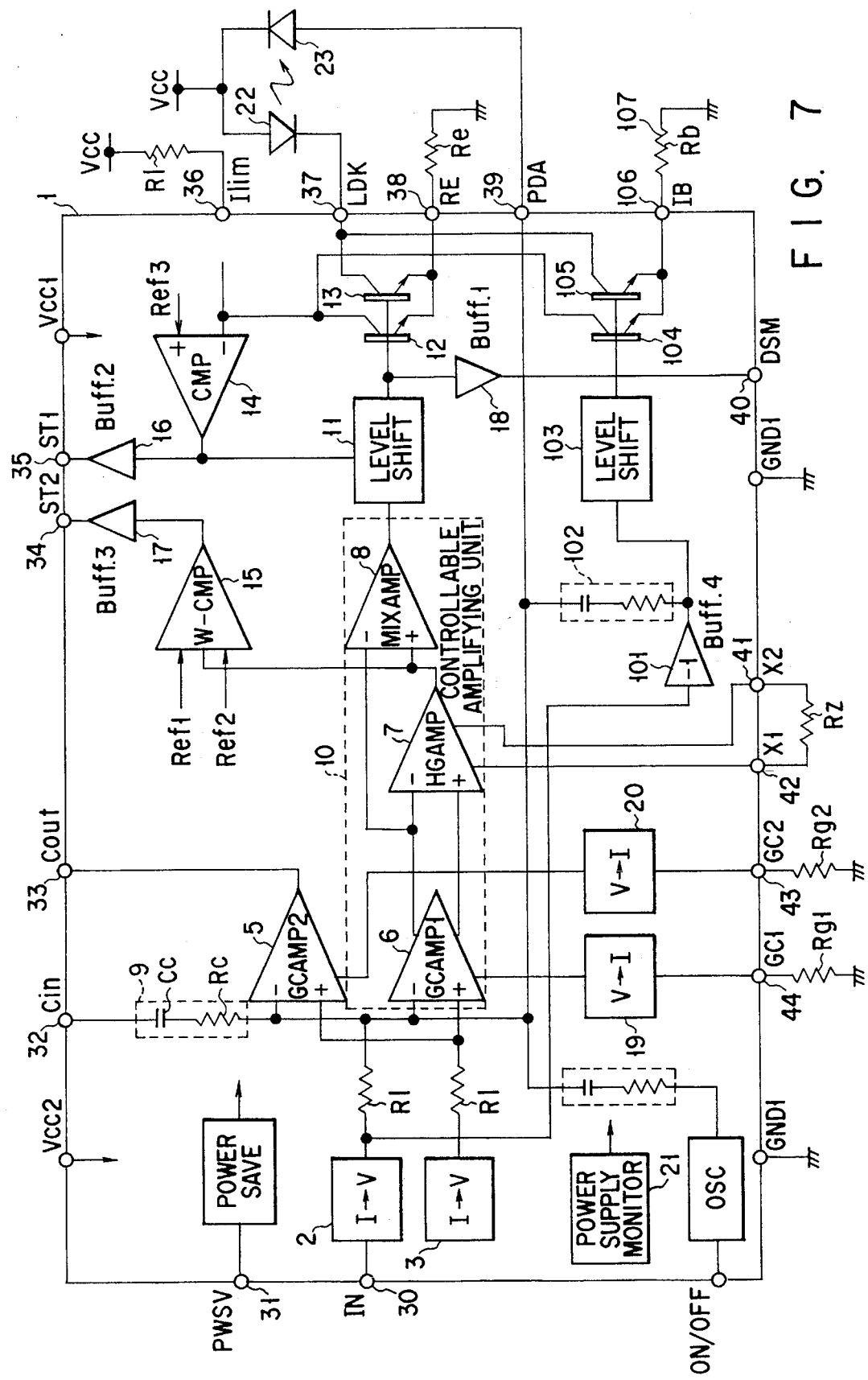
FIG. 7 is a detailed circuit diagram of a semiconductor laser apparatus according to a second embodiment of the present invention.
Figure 8:
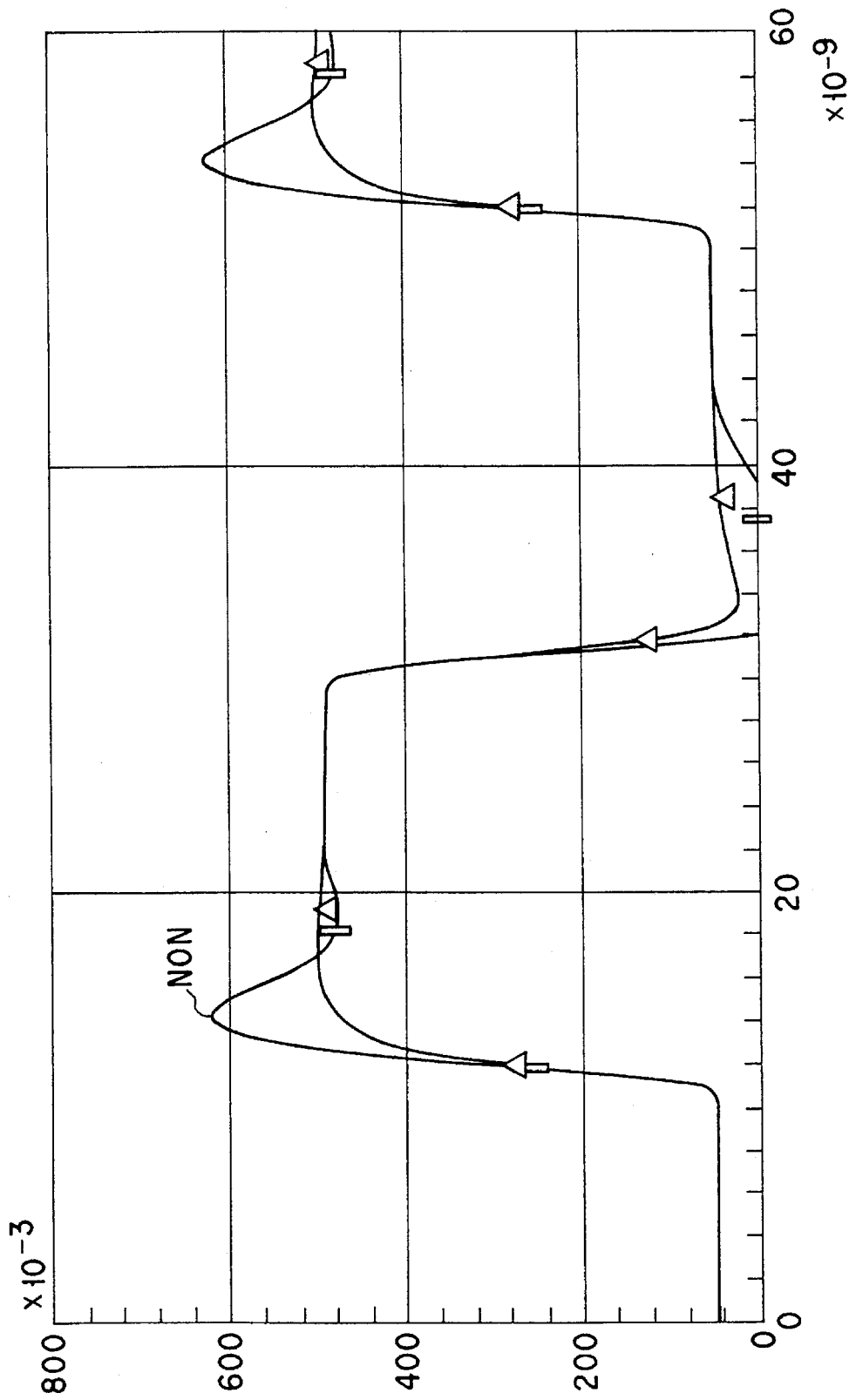
FIG. 8 is a characteristic diagram showing simulation results of pulse characteristics of the semiconductor laser apparatus according to the second embodiment shown in FIG. 7, before and after compensation.

A semiconductor laser apparatus according to a second embodiment of the invention will now be described with reference to FIGS. 7 and 8. When the semiconductor laser apparatus according to the second embodiment is used at a low power supply voltage, this apparatus can amplify the driving current without degrading the pulse characteristics. In FIG. 7, the structural elements common to those shown in FIG. 4 are denoted by like reference numerals, and a description thereof is omitted. Specifically, an output from the input I/V converter 2 is inverted by an inverting buffer AMP101, and the inverted signal is supplied to a drive transistor 105 via a level shift 103. An output from the drive transistor 105 is added to a control system drive transistor 13 at a terminal (LDK) 37. The added signal is supplied to the semiconductor laser 22. The gain of the drive transistor 105 is determined by a resistor (Rb) externally connected to a terminal (IB) 106 (open loop control). An output from the inverting buffer AMP101 is led to a compensation circuit 102 constituted by a series circuit of a resistor R and a capacitor C. The level of a high-frequency compensation current, which is an output from the compensation circuit 102, is limited by a compensation circuit 109 constituted by a series circuit of an oscillator 108, a resistor R and a capacitor C. The thus obtained compensation current is supplied to an inverted input terminal of the variable gain amplifier GCAMP 1.

In FIG. 7, the open loop control is adopted in addition to the feedback control system shown in FIG. 4. In this case, in order to prevent influence to the feedback control system, it is necessary to exactly feed back the feedback current for the open loop control, corresponding to the input signal, to a feedback point, i.e. an inverted input terminal point of the variable gain amplifier GCAMP1. If exact feedback fails, an overshoot of output beam occurs and the characteristics are degraded. The aforementioned high-frequency compensation current functions to compensate a decrease in feedback current in a high-frequency band of the semiconductor laser 22 and photodetector 23, prevent occurrence of overshoot, and avoid influence upon the feedback control system. FIG. 8 shows simulation results of pulse characteristics before and after compensation.

As has been described above, in the second embodiment, two driving means are arranged in parallel so as to supply a driving current in accordance with an input signal. Furthermore, an overshoot occurring due to parallel driving of the two driving means is compensated by delivering a high-frequency component of the input signal to the feedback point.

As a result, the open loop control is performed and the characteristics of the semiconductor laser can be fully exhibited. Therefore, pulse characteristics such as a decrease in pulse rising time can be improved.

Besides, in the vicinity of a light turn-off region, the controllable amplifier HGAMP7 comes into a saturated region and the pulse characteristics deteriorate greatly. According to the parallel driving, the output amplitude of the controllable amplifier is reduced. Thus, the amplifier performs the control without coming into the saturated state, and the light turn-off ratio is remarkably enhanced. Therefore, the load on the control amplifier is reduced, and the light turn-off ratio is improved.

A semiconductor laser apparatus according to a second principle of the invention will now be described with reference to FIG. 9.

As is shown in FIG. 9, the semiconductor laser apparatus according to the second principle comprises a semiconductor laser 510, a photodetector 520, a driving unit 530, a controllable amplifying unit 540, an input decision unit 560, and an output varying unit 570.

The semiconductor laser 510, photodetector 520, driving unit 530 and controllable amplifying unit 540 correspond to those in the semiconductor laser apparatus shown in FIG. 3.

The input decision unit 560 and output varying unit 570 constitute a mode varying unit for varying the mode of the negative feedback in accordance with the value of the control signal. The input decision unit 560 determines at least a zero period of the control signal. The output varying unit 570 delivers a command to the driving unit 530 or controllable amplifying unit 540 so that the driving current to be supplied to the semiconductor laser 510 is forcibly brought to zero, when the input decision unit 560 has determined the zero period of the control signal. In addition, the output varying unit 570 delivers a command to the driving unit 530 or controllable amplifying unit 540 so that the driving current is kept at a value capable of supplying only a threshold current, when the input decision unit 560 has determined the zero period of the control signal.

A semiconductor laser apparatus according to a third principle of the invention will now be described with reference to FIG. 10. As is shown in FIG. 10, the semiconductor laser apparatus according to the third principle comprises a semiconductor laser 510, a photodetector 520, a driving unit 530, a controllable amplifying unit 540, a compensation unit 550, an input decision unit 560, and an output varying unit 570.

The semiconductor laser 510, photodetector 520, driving unit 530 and controllable amplifying unit 540 correspond to those in the semiconductor laser apparatuses shown in FIGS. 3 and 9 according to the first and second principles. The input decision unit 560 and output varying unit 570 correspond to those in the semiconductor laser apparatus according to the second principle. In other words, the semiconductor laser apparatus according to the third principle is a combination of the semiconductor laser apparatuses according to the first and second principles.

Figure 11:
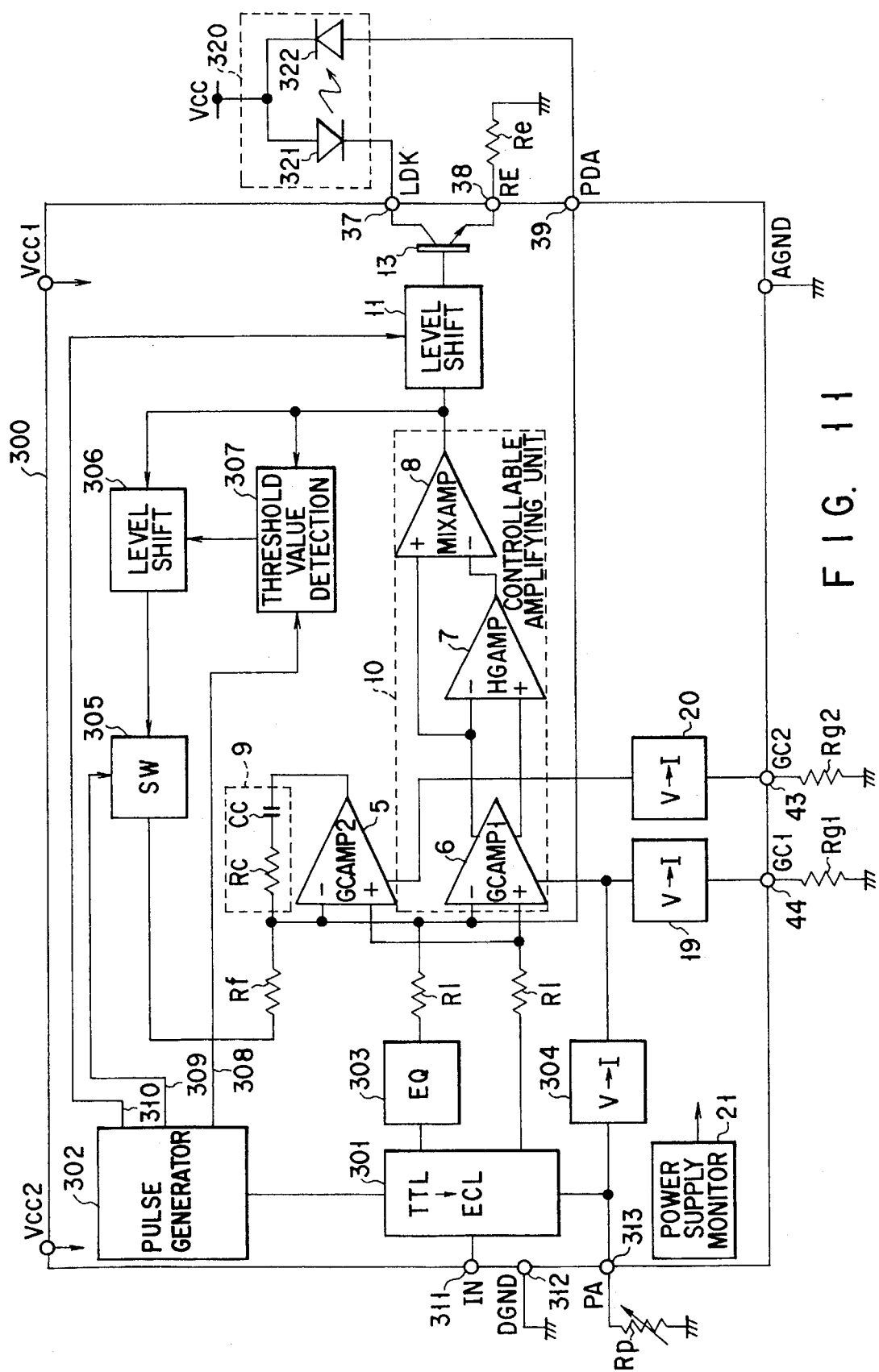
FIG. 11 is a detailed circuit diagram of a semiconductor laser apparatus according to a third embodiment of the present invention.

An embodiment of the semiconductor laser apparatuses according to the second and third principles shown in FIGS. 9 and 10 will now be described. A semiconductor laser apparatus, as shown in FIG. 11, comprises an integrated semiconductor laser control circuit 300, a semiconductor laser unit 320 connected to the semiconductor laser control circuit 300, and resistors externally connected to the semiconductor laser control circuit 300. The semiconductor laser unit 320 comprises a semiconductor laser 321 and a built-in photodetector 322 for monitoring an output beam from the semiconductor laser 321.

The semiconductor laser control circuit 300 has the following structure. An input terminal 311 receives a TTL-level two-value signal from the outside. The converter 301 receives the two-value signal and produces a control voltage signal and a reference voltage. The control voltage signal and reference voltage are input to each of a controllable amplifying unit 10 and a variable gain type differential amplifier 5 functioning as second variable gain means.

The controllable amplifying unit 10 outputs a driving control signal and comprises a variable gain type differential amplifier 6 functioning as first variable gain means, an operational amplifier 7 and a differential amplifier 8 for obtaining a subtraction result from outputs of both amplifiers 6 and 7. The potential of the driving control signal from the differential amplifier 8 is set at a desired level by a level shift 11. The driving control signal set at the desired potential level is delivered to a transistor 13. In accordance with the driving control signal, the transistor 13 supplies a driving current to the semiconductor laser 321.

The semiconductor laser control circuit 300 is also provided with a power supply monitor 21 for detecting a decrease in power supply voltage and automatically halting the control operation.

The control voltage signal from the converter 301 is a modulated signal voltage which is intensity-modulated so as to represent, e.g. digital information. The modulated signal voltage is input to an inverted input terminal of the controllable amplifying unit 10 as a control current via an equalizer 302 and a resistor element Ri. The equalizer 303 compensates undesirable characteristics due to a diffusion delay of the built-in photodetector 322.

The conversion gain of the converter 301 can be varied by the input voltage at a terminal 313. Thereby, a variance in monitor amount of the built-in photodetector 322 can be controlled. The input voltage at the terminal 313 is input to a voltage/current converter 301. An output current from the voltage/current converter 301 is added to an output from a voltage/current converter 19. The gain of the variable gain type differential amplifier 6 is varied by this added output. Thereby, a variation in loop gain due to a variance in monitor amount of the built-in photodetector 322 can be curbed. A reference voltage generated by the converter 301 is input to the non-inverted input terminal of the controllable amplifying unit 10 via a resistor element Ri.

Since the anode of the photodetector 322 is connected to the terminal 39, the monitor current of the photodetector 322 is negative-fed back to the inverted input terminal of the controllable amplifying unit 10 via the terminal 39. Thus, the output beam of the semiconductor laser 321 is intensity-modulated in proportion to the modulated signal voltage which is a control voltage signal from the equalizer 303.

When the input to the converter 301 is at H level, i.e. in the light emission state, the present apparatus functions, like the semiconductor laser apparatus 1 shown in FIG. 4.

When the input to the converter 301 is at L level, the output from the controllable amplifying unit 10 is input to a threshold value detector 307 and a level shifter 306. When the input to the converter 301 is at L level, the threshold value detector 307 detects the threshold value and the level shift 306 is made to perform a desired level shift. An output from the level shift 306 is fed back via a switch 305 and an internal feedback resistor Rf while the input remains at L level. Thus, the output from the controllable amplifying unit 10 is clamped. A pulse generator 302 controls the timing of these operations. In particular, an output 310 from the pulse generator 302 functions so as to bring the output of the level shift 11 to zero. While the input remains at L level, the driving current to the semiconductor laser is set at zero.

Figure 12:
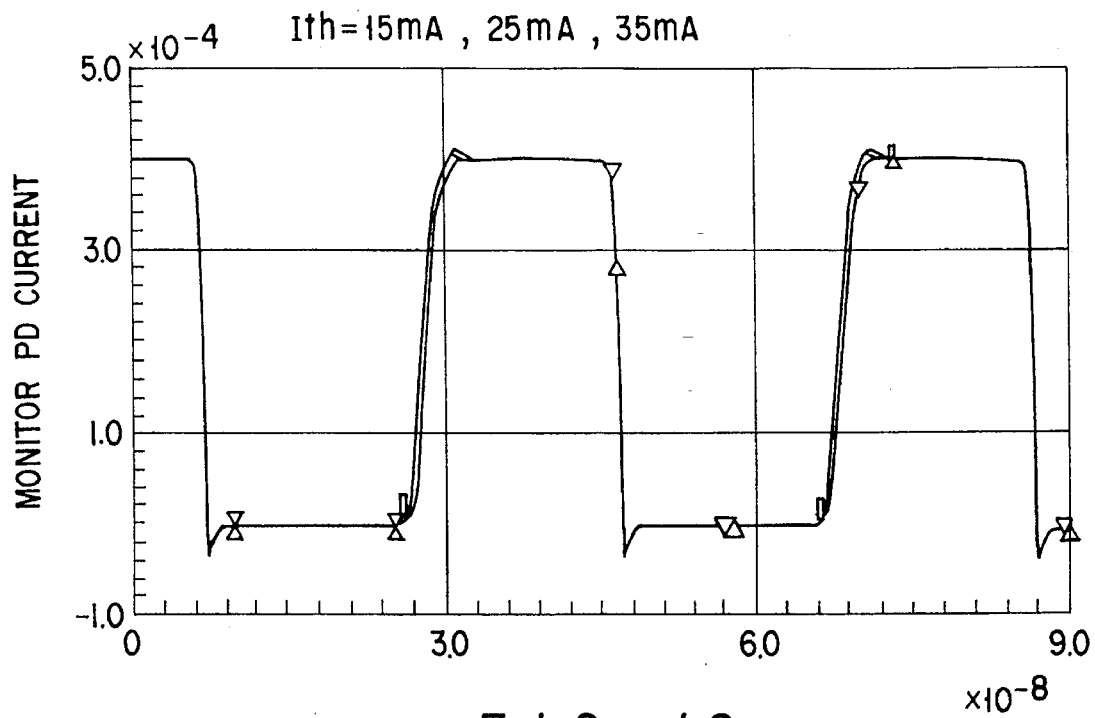
FIG. 12 is a characteristic diagram showing a monitor PD current waveform at the time of on/off control of a semiconductor laser shown in FIG. 11.
Figure 13:
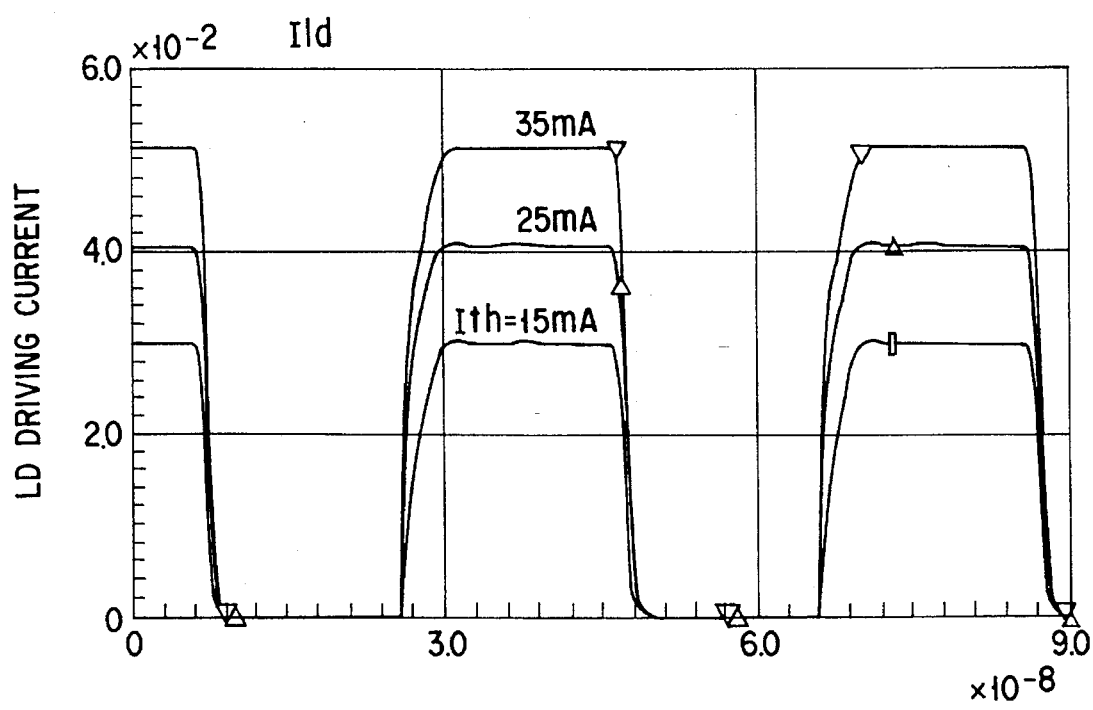
FIG. 13 is a characteristic diagram showing an LD driving current waveform at the time of on/off control of the semiconductor laser shown in FIG. 11.

The above operation will now be described with reference to simulation results. FIG. 12 shows a response waveform of the monitor PD current at the on/off time. The amount of light is exactly zero at the time instant of turn off. At the time instant, too, at which the turned-on feedback loop is set in the regular state, there is no overshoot and good characteristics are exhibited. This is because the controllable amplifying unit 10 constantly continues the feedback operation. FIG. 13 shows a response waveform of an LD driving current at the on/off time. It is understood that the LD driving current is zero at the time of turn-off.

A semiconductor laser apparatus according to a fourth embodiment of the invention will now be described with reference to FIG. 14.

In the semiconductor laser apparatuses of the preceding embodiments, the clamp level is detected by detecting the threshold current level of the semiconductor laser. In this detection method, however, the timing of detection may be exactly detected in some cases.

In addition, in the semiconductor laser apparatuses of the preceding embodiments, a signal component for changing the turn-off state to the turn-on state of the semiconductor laser influences the control loop. Consequently, an overshoot may occur in the light emission output.

Furthermore, in the semiconductor laser apparatuses of the preceding embodiments, the photodetector built in the semiconductor laser unit may exhibit degraded frequency characteristics differing from exact low-band shield characteristics (LPF) owing to a diffusion delay, etc. If the semiconductor laser is feedback-controlled, the light output may have characteristics reverse to those of the feedback control, and pulse characteristics may deteriorate. Thus, in the case of a laser printer having the semiconductor laser apparatus, the printing characteristics may deteriorate.

Figure 14:
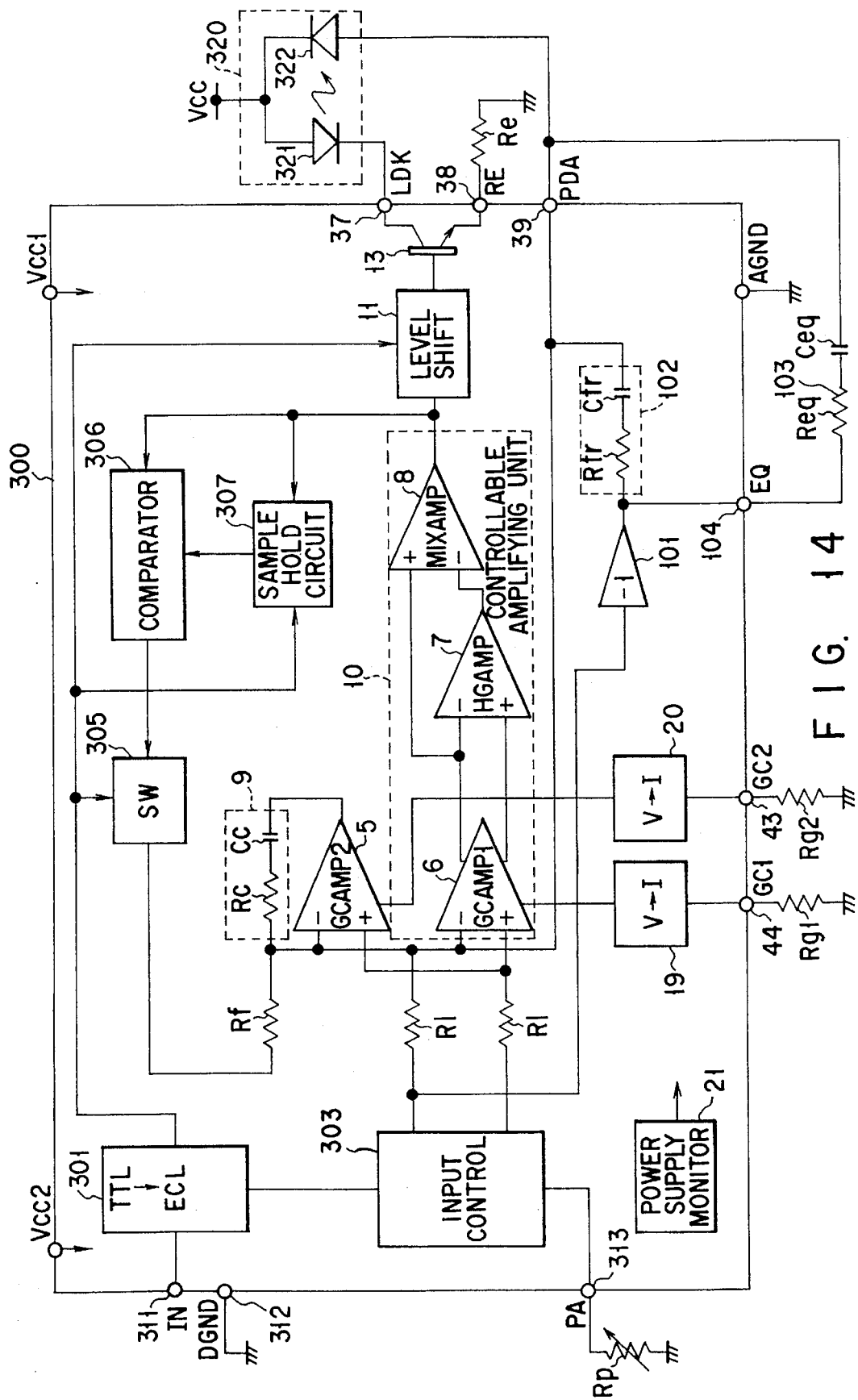
FIG. 14 is a detailed circuit diagram of a semiconductor laser apparatus according to a fourth embodiment of the present invention.

The above problems can be solved by the semiconductor laser apparatus according to the fourth embodiment shown in FIG. 14. Specifically, an external control signal (terminal IN311) is processed by a level converter 301. One of two output signals of the level converter 301 is fed as a control signal to a level shift circuit 11 via a loop switch SW305 and a sampling/holding circuit 307. The other output signal of the level converter 301 is supplied to an input control AMP303 and the level thereof is changed to a control signal level for controlling the light output. The amplitude of an output from the input control AMP303 is varied by an external resistor 313. An inverting buffer 101 supplies a high-frequency compensation current generated by a compensation circuit 102 to a feedback point, thereby preventing an overshoot occurring due to on/off control of the semiconductor laser 321. An output from the inverting buffer 101 is supplied to an external supply terminal 104(EQ), and an external circuit 103 compensates degradation of characteristics of the photodetector 322.

Specifically, in the semiconductor laser apparatus of the fourth embodiment, attention is paid to the fact that a constantly obtainable signal level of the control system is a control output level at the time of light emission. Based on this fact, a sampling/holding circuit is provided for detecting a level at the time of light emission.

Like the embodiment shown in FIG. 7, the on/off control of the semiconductor laser 321 is achieved by the output level shift 11 as open loop control. Accordingly, the delay phase is compensated, like the embodiment shown in FIG. 7.

Furthermore, a high-frequency component of the input signal is delivered to the feedback point by the external circuit (external resistor 313). Thereby, undesirable characteristics of the built-in photodetector 322 of the semiconductor laser unit 320 are compensated.

As has been described above, in the semiconductor laser apparatus of the fourth embodiment, the clamp level is set at a value at the time of light emission. Thereby, complex processes such as a detection timing process are not needed and the circuit configuration is simplified. Besides, an overshoot at the time of light emission is avoided, and the adjustment of switching timing is not required. Furthermore, since the characteristics of the photodetector 322 is compensated by the external circuit (external resistor 313), the applicability of the apparatus is increased.

Figure 15:
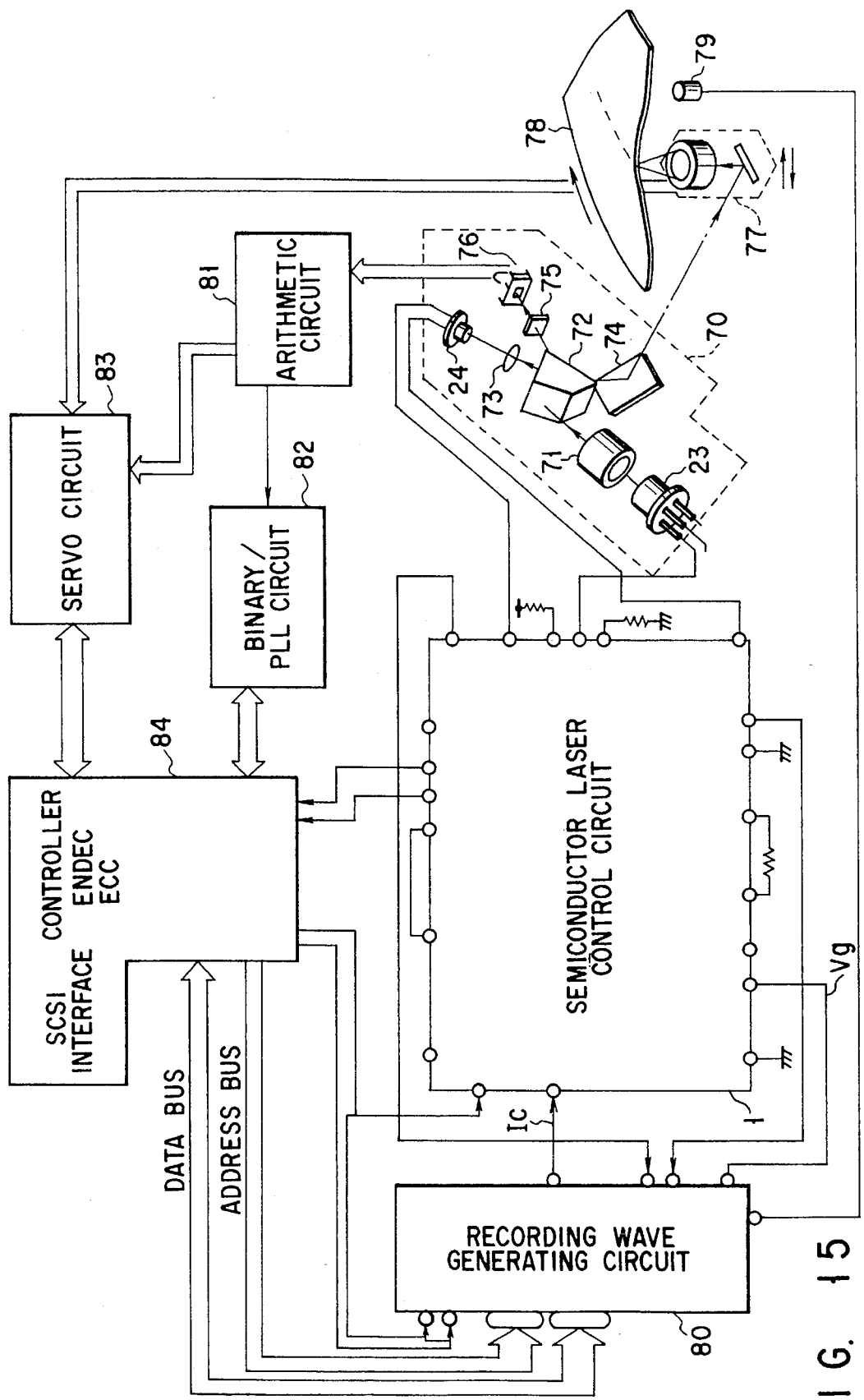
FIG. 15 shows the structure of an optical disk apparatus using the semiconductor laser apparatus according to the first embodiment shown in FIG. 4.

An information recording/reproducing apparatus using the semiconductor laser apparatus according to the first embodiment of the invention will now be described with reference to FIG. 15. Specifically, the semiconductor laser control circuit 1 including the controllable amplifying unit 10 and driving circuit 13 is controlled by a recording wave generating circuit 80 for generating a control current Ic and a gain control voltage Vg. The semiconductor laser 23 and monitor photodetector 24 shown in FIG. 4 are provided on a stationary optical unit 70.

When data is written on an optical disk 78, the semiconductor laser 23 emits a laser beam in accordance with a control current Ic modulated by information in an analog or digital manner. An output beam from the semiconductor laser 23 is guided to a movable optical head 77 by the optical unit 70 comprising a collimator lens, a composite prism, a galvano mirror, a reproducing hologram device, etc. The movable optical head 77 is designed to be linearly movable in the radial direction of the optical disk 78 which is rotatably mounted on the information recording/reproducing apparatus.

When data recorded on the optical disk 78 is reproduced, the semiconductor laser 23 outputs as a readout beam a laser beam having a weaker intensity than the laser beam for used in recording data. In this case, too, the readout beam is similarly led to the optical disk 78 from the optical unit 70 and movable optical head 77. A reflection beam from the optical disk 78 at this time returns from the optical head 77 to the optical unit 70. In the optical unit 70, the beam is separated by the composite prism 72 and converged on a reproducing photodetector 76 by the reproducing hologram device.

Part of the output beam from the semiconductor laser 23 is separated by the composite prism and input to the photodetector 24. Thus, the beam is not radiated on an area other than the light-receiving face of the photodetector 24.

Thereby, the occurrence of an unnecessary diffusion delay signal is prevented.

A detection output of the reproducing photodetector 76 is led to an arithmetic operation circuit 81 comprising a preamplifier and an arithmetic circuit. In the arithmetic operation circuit 81, a reproduction information signal and a servo signal are separated. The servo signal is delivered to a servo circuit 83 to control the movable optical head 77. The reproduction information signal is delivered to a binary/PLL circuit 82 for generating a digitally processable binary signal and a reproduction clock. Then, the reproduction signal is fed to a disk controller 84. The disk controller 84 comprises a modem circuit and a correction error circuit, as well as a controller for controlling the servo circuit 83 and recording wave generating circuit 80, an SCSI interface, etc. The disk controller 84 determines the abnormality detection state of the semiconductor laser control circuit 1 and achieves the stable operation of the information recording/reproducing apparatus.

The recording wave generating circuit 80 comprises a D/A converter for exactly setting the control current signal Ic, and an A/D converter for reading a monitor output signal from the semiconductor laser control circuit 1 and performs data transmission with the controller 84 through a data bus.

Figure 16:
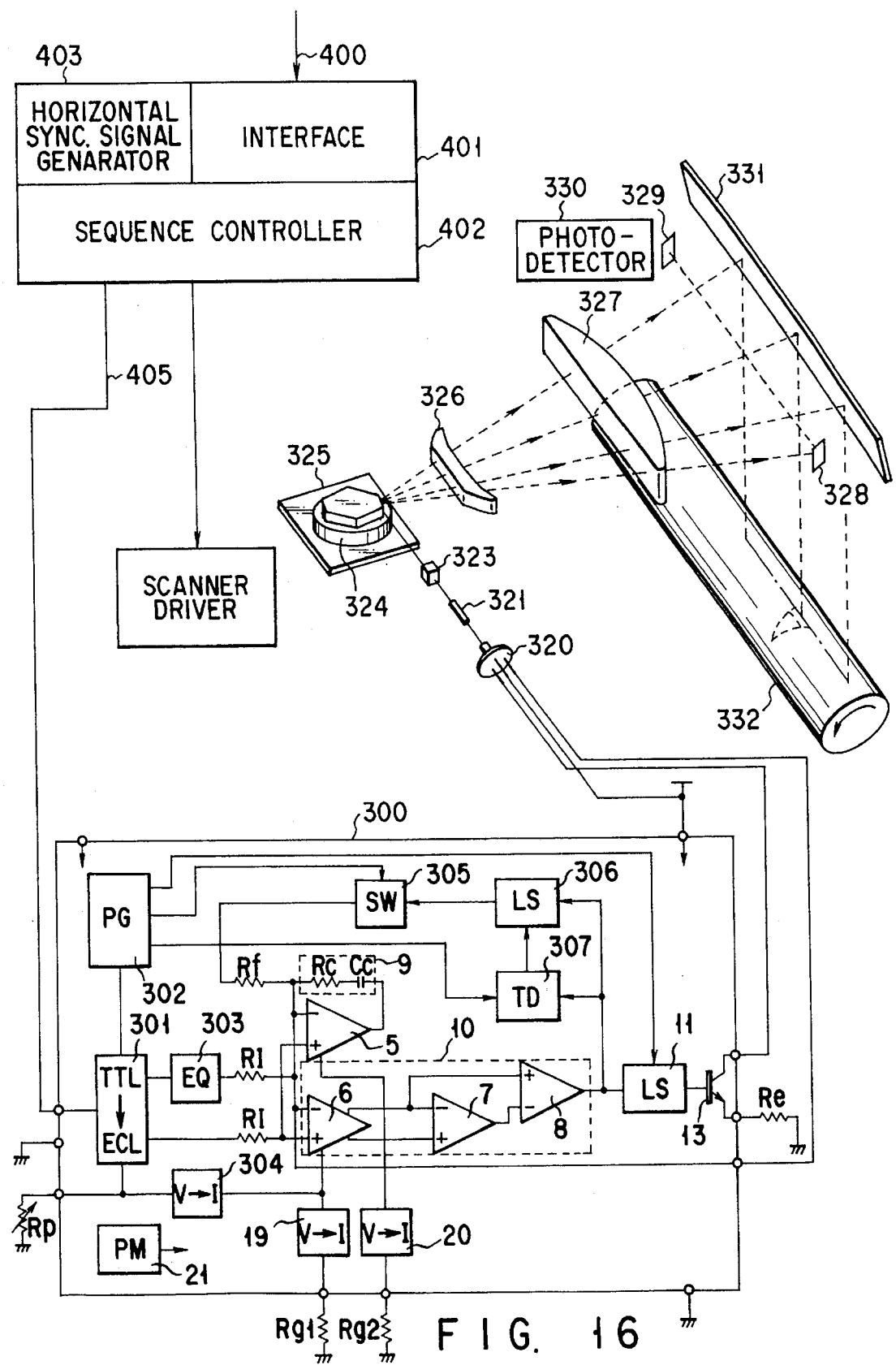
FIG. 16 shows the structure of an image recording apparatus using the semiconductor laser apparatus according to the third embodiment shown in FIG. 11.

An image recording apparatus using the semiconductor laser apparatus according to the third embodiment of the invention will now be described with reference to FIG. 16. In FIG. 16, a video signal 400 output from an image controller (not shown) is fed to an input terminal 311 of a semiconductor laser control circuit 300 from a sequence controller 402 via an interface 401. The semiconductor laser control circuit 300 turns on/off the laser with high light-amount setting precision and high-speed response performance in accordance with a laser control signal produced on the basis of the video signal 400. The laser output beam from the control circuit 300 is radiated on a polygon mirror 325 via a collimator lens 320 and a cylindrical lens 321. The polygon mirror 325 is rotated at a constant speed. The laser beam reflected by the polygon mirror 325 is passed through a toric lens 326 and a combination lens 327 and is then reflected by a mirror 331. The reflected beam is made to scan a photosensitive drum 332.

The photosensitive drum 332 is rotated at a constant speed so that the scan area does not overlap. An image is formed on the drum 332 in dots. Since the dots are partially overlapped to produce the image, the dots are connected like lines and a continuous image is obtained.

The timing of the laser beam is detected by a photodetector 330 each time the laser beam has completed a single scan operation over the surface of the polygon mirror 325. Thus, the output timing of the laser control signal is adjusted by a horizontal sync signal generator 403. The high-speed response characteristics of the semiconductor laser control circuit 300 can remarkably increase the printing speed. The high light-amount setting precision can fully prevent unclear printing and achieve high-resolution printing. On the other hand, a sampling method in which the amount of light is controlled before scanning is known as a conventional method of controlling the amount of light. In this conventional method, the load on the sequence controller is great, resulting in a high cost.

As has been described above, according to the present invention, the first variable gain amplifier is provided at the first stage of the control amplifier. Thus, even if the gain of the first variable gain amplifier is varied, the dynamic range of the rear-stage control amplifier having a higher gain is not degraded. Therefore, high-precision control can be performed even if there is a problem of, in particular, a variation in threshold current.

Since the second variable gain amplifier is provided independent from the feedback control loop, the phase compensation of the feedback can be performed independently. In addition, since the gain is variable, the constant in the compensation means does not need to be altered, and the cost for parts and adjustment is reduced.

Since the driving current to the semiconductor laser is forcibly set at zero while the control signal is at zero level, the power consumption is reduced.

When the present semiconductor laser apparatus is used in the information recording/reproducing apparatus, problems due to variations in various factors can be solved and the yield of manufactured devices can be increased.

Furthermore, when the present semiconductor laser apparatus is used in the information recording apparatus, high-quality images can be obtained at high speed by virtue of the high light turn-off ratio, high light-amount setting precision and high-speed, stable pulse characteristics.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor apparatus comprising:

a semiconductor laser;

a photodetector for detecting an output beam of said semiconductor laser;

a driving unit for driving said semiconductor laser;

a controllable amplifying unit for receiving an externally supplied control signal and an output beam of said photodetector and supplying a drive signal determined by said control signal and said output beam of the photodetector to said driving unit, thereby feedback-controlling the output of the semiconductor laser; and a compensation unit for actively controlling the phase of a feedback control loop constituted by said photodetector, said driving unit and said controllable amplifying unit in accordance with temporal and electrical behaviors of the feedback control loop.

2. The semiconductor apparatus according to claim 1, wherein said compensation unit comprises a variable gain amplifier and a CR circuit including a capacitance and a resistor, said control signal and said output beam of the photodetector are delivered to input terminals of said variable gain amplifier, an output terminal of said variable gain amplifier is connected to one terminal of said CR circuit, and the other terminal of the CR circuit is connected to an input of the controllable amplifying unit.

3. The semiconductor laser according to claim 2, wherein said variable gain amplifier has flat frequency characteristics up to a frequency band of at least 1.5 times the control band of said variable gain amplifier.

4. The semiconductor laser apparatus according to claim 1, wherein said controllable amplifying unit includes at least a variable gain differential amplifier functioning as a first-stage amplifier, and a rear-stage amplifier having a higher gain than said first-stage amplifier.

5. The semiconductor laser apparatus according to claim 1, wherein said semiconductor laser, said photodetector, said driving unit, said controllable amplifying unit and said compensation unit are constituted as a one chip structure.

6. The semiconductor laser apparatus according to claim 1, further comprising a mode varying unit for varying the mode of said feedback control in accordance with the value of said control signal.

7. The semiconductor laser apparatus according to claim 6, wherein said mode varying unit comprises means for forcibly reducing the drive current to be supplied to said semiconductor laser to zero, while the value of said control signal is being zero.

8. The semiconductor laser apparatus according to claim 6, wherein said mode varying unit comprises clamp means for clamping the output of said controllable amplifying unit to a value capable of supplying a threshold current to said semiconductor laser, while the value of said control signal is being zero.

9. The semiconductor laser apparatus according to claim 6, wherein said semiconductor laser, said photodetector, said driving unit, said controllable amplifying unit, said compensation unit and said mode varying unit are constituted as a one chip structure.

10. A semiconductor apparatus comprising:
   a semiconductor laser;
   a photodetector for detecting an output beam of said semiconductor laser;
   a driving unit for driving said semiconductor laser;
   a controllable amplifying unit for receiving an externally supplied control signal and an output beam of said photodetector and supplying a drive signal determined by said control signal and said output beam of the photodetector to said driving unit, thereby feedback-controlling the output of the semiconductor laser; and
   a mode varying unit for varying the mode of said feedback control in accordance with the value of said control signal.

11. The semiconductor laser apparatus according to claim 10, wherein said mode varying unit comprises means for forcibly reducing the drive current to be supplied to said semiconductor laser to zero, while the value of said control signal is being zero.

12. The semiconductor laser apparatus according to claim 10, wherein said mode varying unit comprises clamp means for clamping the output of said controllable amplifying unit to a value capable of supplying a threshold current to said semiconductor laser, while the value of said control signal is being zero.

13. The semiconductor laser apparatus according to claim 10, wherein said controllable amplifying unit includes at least a variable gain differential amplifier functioning as a first-stage amplifier, and a rear-stage amplifier having a higher gain than said first-stage amplifier.

14. The semiconductor laser apparatus according to claim 10, wherein said semiconductor laser, said photodetector, said driving unit, said controllable amplifying unit and said mode varying unit are constituted as a one chip structure.

15. An information recording/reproducing apparatus comprising:
   a semiconductor laser apparatus having a semiconductor laser, a photodetector for detecting an output beam of said semiconductor laser, a driving unit for driving said semiconductor laser, a controllable amplifying unit for receiving an externally supplied control signal and an output beam of said photodetector and supplying a drive signal determined by said control signal and said output beam of the photodetector to said driving unit, thereby feedback-controlling the output of the semiconductor laser; and a compensation unit for actively controlling the phase of a feedback control loop constituted by said photodetector, said driving unit and said controllable amplifying unit in accordance with temporal and electrical behaviors of the feedback control loop;
   a radiation unit for radiating an output beam of said semiconductor laser apparatus to a recording medium;
   a detection unit for detecting a reflection beam from the recording medium;
   a reproduction signal generating unit for generating a reproduction signal from an output of said detection unit; and
   a control signal generating unit for generating said control signal to be supplied to said semiconductor laser apparatus.

16. The information recording/reproducing apparatus according to claim 15, wherein said compensation unit of the semiconductor laser apparatus comprises a variable gain amplifier and a CR circuit including a capacitance and a resistor,
   said control signal and said output beam of the photodetector are delivered to input terminals of said variable gain amplifier,
   an output terminal of said variable gain amplifier is connected to one terminal of said CR circuit, and
   the other terminal of the CR circuit is connected to an input of the controllable amplifying unit.

17. The information recording/reproducing apparatus according to claim 16, wherein said variable gain amplifier has flat frequency characteristics up to a frequency band of at least 1.5 times the control band of said variable gain amplifier.

18. The information recording/reproducing apparatus according to claim 15, wherein said controllable amplifying unit includes at least a variable gain differential amplifier functioning as a first-stage amplifier, and a rear-stage amplifier having a higher gain than said first-stage amplifier.

19. An image recording apparatus comprising:
   a semiconductor laser apparatus having a semiconductor laser, a photodetector for detecting an output beam of said semiconductor laser, a driving unit for driving said semiconductor laser, a controllable amplifying unit for receiving an externally supplied control signal and an output beam of said photodetector and supplying a drive signal determined by said control signal and said output beam of the photodetector to said driving unit, thereby feedback-controlling the output of the semiconductor laser; and a compensation unit for actively controlling the phase of a feedback control loop constituted by said photodetector, said driving unit and said controllable amplifying unit in accordance with temporal and electrical behaviors of the feedback control loop;
   a scanning unit for scanning an output beam of said semiconductor laser apparatus on a photosensitive body;
   an image forming unit for making visible a latent image formed by the scanning of said scanning unit; and
   a reproduction signal generating unit for generating said control signal to be supplied to said semiconductor laser apparatus.

20. The image recording apparatus according to claim 19, wherein said compensation unit comprises a variable gain amplifier and a CR circuit including a capacitance and a resistor, said control signal and said output beam of the photodetector are delivered to input terminals of said variable gain amplifier, an output terminal of said variable gain amplifier is connected to one terminal of said CR circuit, and the other terminal of the CR circuit is connected to an input of the controllable amplifying unit.

21. The image recording apparatus according to claim 20, wherein said variable gain amplifier has flat frequency characteristics up to a frequency band of at least 1.5 times the control band of said variable gain amplifier.

22. The image recording apparatus according to claim 20, wherein said controllable amplifying unit includes at least a variable gain differential amplifier functioning as a first-stage amplifier, and a rear-stage amplifier having a higher gain than said first-stage amplifier.

23. The image recording apparatus according to claim 20, further comprising a mode varying unit for varying the mode of said feedback control in accordance with the value of said control signal.

24. The image recording apparatus according to claim 23, wherein said mode varying unit comprises means for forcibly reducing the drive current to be supplied to said semiconductor laser to zero, while the value of said control signal is being zero.

25. The image recording apparatus according to claim 23, wherein said mode varying unit comprises clamp means for clamping the output of said controllable amplifying unit to a value capable of supplying a threshold current to said semiconductor laser, while the value of said control signal is being zero.

26. An image recording apparatus comprising:

a semiconductor laser apparatus having a semiconductor laser, a photodetector for detecting an output beam of said semiconductor laser, a driving unit for driving said semiconductor laser, a controllable amplifying unit for receiving an externally supplied control signal and an output beam of said photodetector and supplying a drive signal determined by said control signal and said output beam of the photodetector to said driving unit, thereby feedback-controlling the output of the semiconductor laser; and a mode varying unit for varying the mode of said feedback control in accordance with the value of said control signal;

a radiation unit for radiating an output beam of said semiconductor laser apparatus to a recording medium;

a detection unit for detecting a reflection beam from the recording medium; and a reproduction signal generating unit for generating said control signal to be supplied to said semiconductor laser apparatus.

27. The image recording apparatus according to claim 26, wherein said controllable amplifying unit includes at least a variable gain differential amplifier functioning as a first-stage amplifier, and a rear-stage amplifier having a higher gain than said first-stage amplifier.

28. The image recording apparatus according to claim 26, wherein said mode varying unit comprises means for forcibly reducing the drive current to be supplied to said semiconductor laser to zero, while the value of said control signal is being zero.

29. The image recording apparatus according to 10 claim 26, wherein said mode varying unit comprises clamp means for clamping the output of said controllable amplifying unit to a value capable of supplying a threshold current to said semiconductor laser, while the value of said control signal is being zero.

* * * * *

UNITED STATES PATENT AND TRADEMARK OFFICE
CERTIFICATE OF CORRECTION

PATENT NO.   : 5,579,329
DATED        : November 26, 1996
INVENTOR(S)  : Toyoki TAGUCHI It is certified that error appears in the above-indentified patent and that said Letters Patent is hereby corrected as shown below:

Claim 29, Column 18, Line 32, after "according to" delete "10".

Signed and Sealed this

Twentieth Day of May, 1997

*Attest:*

*Attesting Officer*

BRUCE LEHMAN

Commissioner of Patents and Trademarks